United States Patent
Yamazaki

[19]

[11] Patent Number: 6,130,118
[45] Date of Patent: Oct. 10, 2000

[54] PLASMA REACTION APPARATUS AND PLASMA REACTION

[75] Inventor: Shunpei Yamazaki, Tokyo, Japan

[73] Assignee: Semiconductor Energy Laboratory Co., Ltd., Kanagawa, Japan

[21] Appl. No.: 08/804,294

[22] Filed: Mar. 3, 1997

Related U.S. Application Data

[60] Continuation of application No. 08/462,739, Jun. 5, 1995, abandoned, which is a division of application No. 08/248,688, May 25, 1994, abandoned.

[30] Foreign Application Priority Data

May 27, 1993 [JP] Japan ..................................... 5-148542

[51] Int. Cl.[7] ................................................. H01L 21/316
[52] U.S. Cl. .................... 438/151; 438/164; 438/758; 438/789; 427/572; 427/579
[58] Field of Search .................... 438/789, 758, 438/151, 164; 427/579, 572; 148/DIG. 118

[56] References Cited

U.S. PATENT DOCUMENTS

| | | | |
|---|---|---|---|
| 4,495,218 | 1/1985 | Azuma et al. | 427/53.1 |
| 4,800,174 | 1/1989 | Ishihara et al. | 118/723 E |
| 4,832,981 | 5/1989 | Yamazaki et al. | 118/723 E |
| 5,007,374 | 4/1991 | Yamazaki et al. | 118/723 E |
| 5,149,931 | 9/1992 | Magara | 219/69.13 |
| 5,223,039 | 6/1993 | Suzuki | 118/723 MP |
| 5,223,443 | 6/1993 | Chinn et al. | 437/8 |
| 5,330,606 | 7/1994 | Kubota et al. | 156/345 |
| 5,332,880 | 7/1994 | Kubota et al. | 156/345 |
| 5,345,145 | 9/1994 | Harafuji et al. | 315/111.41 |
| 5,404,079 | 4/1995 | Ohkuni et al. | 315/111.81 |
| 5,424,905 | 6/1995 | Nomura et al. | 361/238 |

FOREIGN PATENT DOCUMENTS

| | | |
|---|---|---|
| 60-62113 | of 1985 | Japan . |
| 406045096 | 2/1994 | Japan . |

OTHER PUBLICATIONS

Ibaraki, "Low–Temperature Poly–Si TFT Technology", SID 99 Digest, 15.1 Invited Paper, (1999), pp. 172–175.

Kawamura et al., "Back–Channel Effects on the Threshold Voltage of Low–Temperature Poly–Si TFTs with $SiN_x/SiO_2$ Dual Under Layer", SID 99 Digest—P2, (1999), pp. 456–459.

Hayasaka, N et al, "High Quality and Low Dielectric Contant $SiO_2$ CVD Using High Density Plasma", 1993 Dry Process Symposium, p. 163.

Shimokawa, Kimiaki "Fluorine Doped $SiO_2$ with Low Dielectric Constant for Multilevel Interconnection", p. 211.

Fukasa Takashi "Prepartion of SiOF Films with Low Dielectric Constant by ECR Plasma CVD", In Conf of Solid State, Rev.

Primary Examiner—Charles Bowers
Assistant Examiner—Matthew Whipple
Attorney, Agent, or Firm—Sixbey, Friedman, Leedom & Ferguson; Gerald J. Ferguson, Jr.; Jeffrey L. Costellia

[57] ABSTRACT

A process for depositing a film at a high rate and with superior step coverage properties, which comprises installing a pair of electrodes crossing with another pair of electrodes making a right angle with respect to the another pair, and applying a high frequency power differing in phase to the electrodes in order to apply a high frequency power having a Lissajous' waveform in the reaction space during the deposition of a film on a substrate.

20 Claims, 5 Drawing Sheets

PLASMA REACTION APPARATUS AND PLASMA REACTION

This application is a Continuation of Ser. No. 08/462,739, filed Jun. 5, 1995, now abandoned; which itself is a divisional of Ser. No. 08/248,688, filed May 25, 1994, now abandoned.

BACKGROUND OF THE INVENTION

1. Field of the Invention

The present invention relates to a plasma reaction apparatus, particularly an apparatus for depositing a film such as a semiconductor film and an insulation film. The present invention also relates to a plasma reaction method, particularly a process for depositing a film.

2. Prior Art

Conventionally known processes for depositing semiconductor films and insulation films include plasma CVD, sputtering, low pressure CVD, and photochemical vapor deposition. However, none of the enumerated processes satisfy both of the demands of high speed deposition and high step coverage at the same time.

Accordingly, an object of the present invention is to provide a process for depositing a film, which enables the deposition of a film at a high speed and yet, with an excellent step coverage. Another object of the present invention is to provide an apparatus for depositing a film which realizes the film deposition process above.

SUMMARY OF THE PRESENT INVENTION

The present invention provides a plasma reaction apparatus, e.g. a film deposition apparatus, of a parallel planar type comprising electrodes being arranged in parallel with each other at a distance of 10 mm or less. The rate of film deposition can be increased by thus setting the electrodes. Furthermore, a film having an improved step coverage can be realized by irradiating an ultraviolet light to the electrode during the film deposition. In addition to the aforementioned constitution of the apparatus, two pairs of parallel planar type electrodes are placed in such a manner that one pair may cross the other pair making a right angle with respect to the other pair. In this manner, an electric field, e.g. an alternating electric field, can be applied in parallel with the substrate. A high frequency electric field (electric power) having a Lissajous' waveform is applied to the substrate from the two pairs of electrodes in order to stir and activate the reaction gas. In this manner, the rate of film deposition can be increased and the step coverage properties can be improved.

A plasma reaction method in accordance with the present invention comprises:

effecting a vapor phase reaction by applying an alternating electric power having a Lissajous' waveform from two pairs of electrodes arranged in such a manner that the two pairs may cross each other making a right angle with respect to each other, while irradiating an ultraviolet light thereto.

DETAILED DESCRIPTION OF THE INVENTION

The high frequency electric field having a Lissajous' waveform is supplied from two pairs of electrodes arranged in such a manner that one of the pairs may cross the other making a right angle with respect to the other pair, by applying, to each pair of the electrodes, a high frequency electric power of same frequency but differing in phase. Each of the pairs of the electrodes is composed of a pair of parallel planar type electrodes. The high frequency electric power applied in differing phase preferably has the same frequency, or at a frequency as such that one may be a harmonic of the other.

The plasma reaction apparatus, e.g. film deposition apparatus, comprises a pair of parallel planar type electrodes set at a small distance from each other and in parallel with a substrate to be placed in the apparatus. In this manner, the rate of film deposition can be considerably accelerated. Furthermore, the height of step coverage can be increased by irradiating a ultraviolet light. By applying a high frequency electric power having a Lissajous' waveform, the electrons and ions can be efficiently vibrated or rotated to enhance the stirring and the activation of the reaction gas. Thus, a high rate of film deposition and a film having excellent step coverage can be implemented.

The present invention is illustrated in greater detail referring to non-limiting examples below with the attached figures. It should be understood, however, that the present invention is not to be construed as being limited thereto.

EXAMPLE 1

Figure 1:
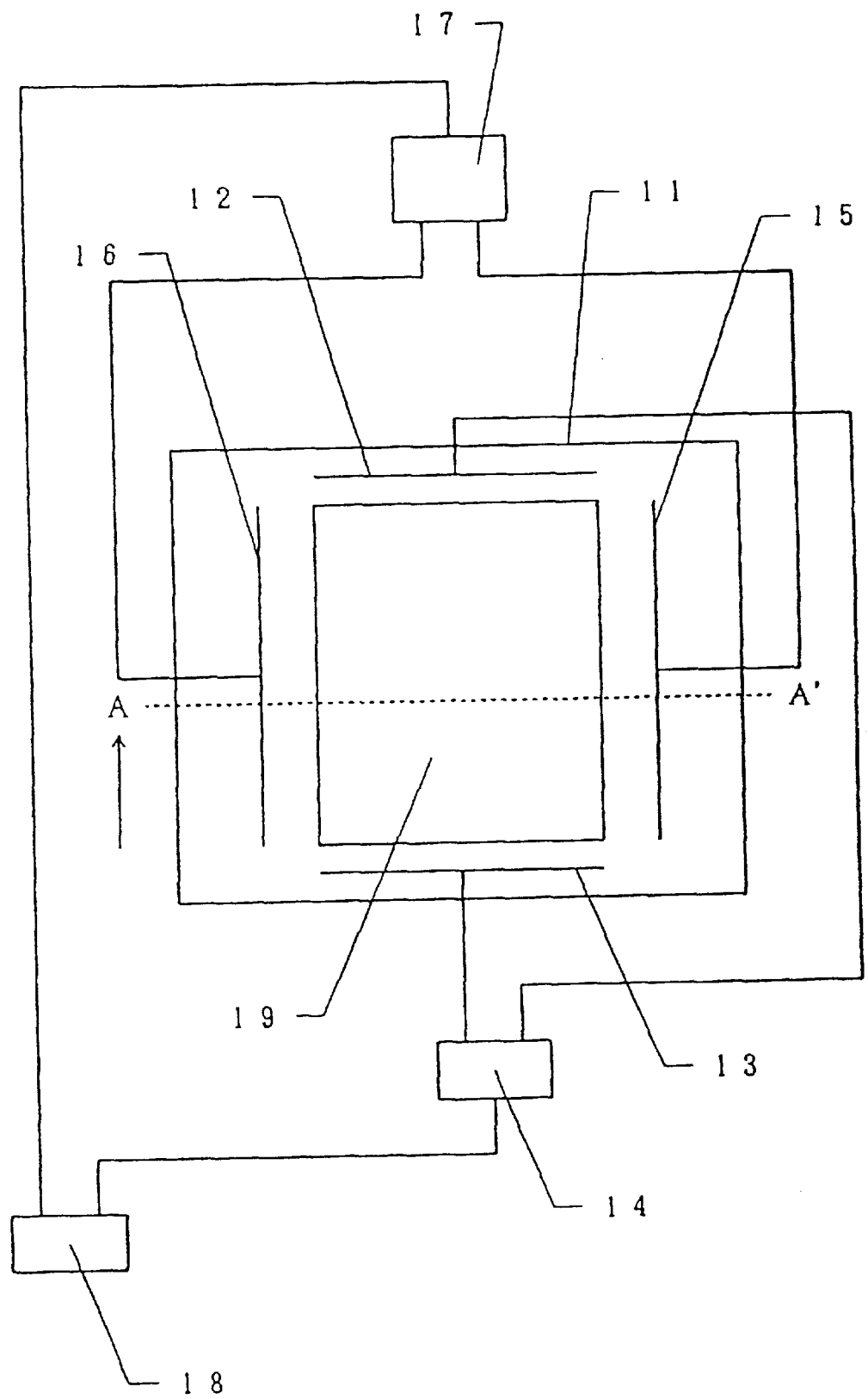
FIG. 1 is a schematically shown film deposition apparatus according to an embodiment of the present invention.

Referring to FIG. 1, an apparatus for depositing a film according to an embodiment of the present invention is described below. FIG. 1 shows the cross section view from the upper side of the film deposition apparatus according to the present invention. A substrate 19 is placed inside a vacuum chamber 11 whose pressure can be reduced by means of a vacuum system (not shown in the figure). The reaction gas and the dilution gas necessary for the film deposition process, or a doping gas and the like are supplied into the chamber 11 by a gas supply system (not shown in the figure). The reaction gas supplied into the chamber is activated by a high frequency electric power having a Lissajous' waveform applied by a pair of electrodes 12 and 13, and also by another pair of electrodes 15 and 16 provided in such a manner that they make a right angle with respect to the pair of electrodes 12 and 13. Thus, in this case, it can be seen that the pair of electrodes 12 and 13 are arranged to make a right angle with the pair of electrodes 15 and 16, and they altogether make the two pairs of electrodes placed crossing with each other.

A high frequency electric power (alternating electric field) is supplied to a pair of electrodes 12 and 13 by a high frequency power supply system 14 comprising an oscillator, an amplifier, and a matching circuit. Similarly, a high frequency electric power (alternating electric field) is supplied to the other pair of electrodes 15 and 16 by a high frequency power supply system 17 also comprising an oscillator, an amplifier, and a matching circuit. The phases of the high frequency electric power supplied independently from each of the high frequency electric power supply systems 14 and 17 are adjusted by a phase lock mechanism 18 in such a manner that they may differ from each other. By thus controlling the phase difference, a high frequency electric power having a Lissajous' waveform can be applied to the reaction space having a substrate 19 placed therein. Thus, the reaction gas can be stirred and activated further by allowing the electrons or the ions to move in accordance with a Lissajous' figure. In general, the phase difference is set at an angle of 90°, but the phase difference is not only limited thereto. Furthermore, the phase difference can be varied as a function of time; i.e., the Lissajous' figure can be changed with time. In the apparatus according to the present invention, the high frequency power is supplied from the high frequency power supply systems 14 and 17 at a frequency of 50 MHz. The frequency of this high frequency power can be varied in the range of from 1 to 1,000 MHz, and the supply systems may each supply power differing in frequency. However, the high frequency power systems preferably supply a power of the same frequency; otherwise, one of the power systems may supply a power at a frequency corresponding to a harmonic of the high frequency power supplied by the other power supply system.

Figure 2:
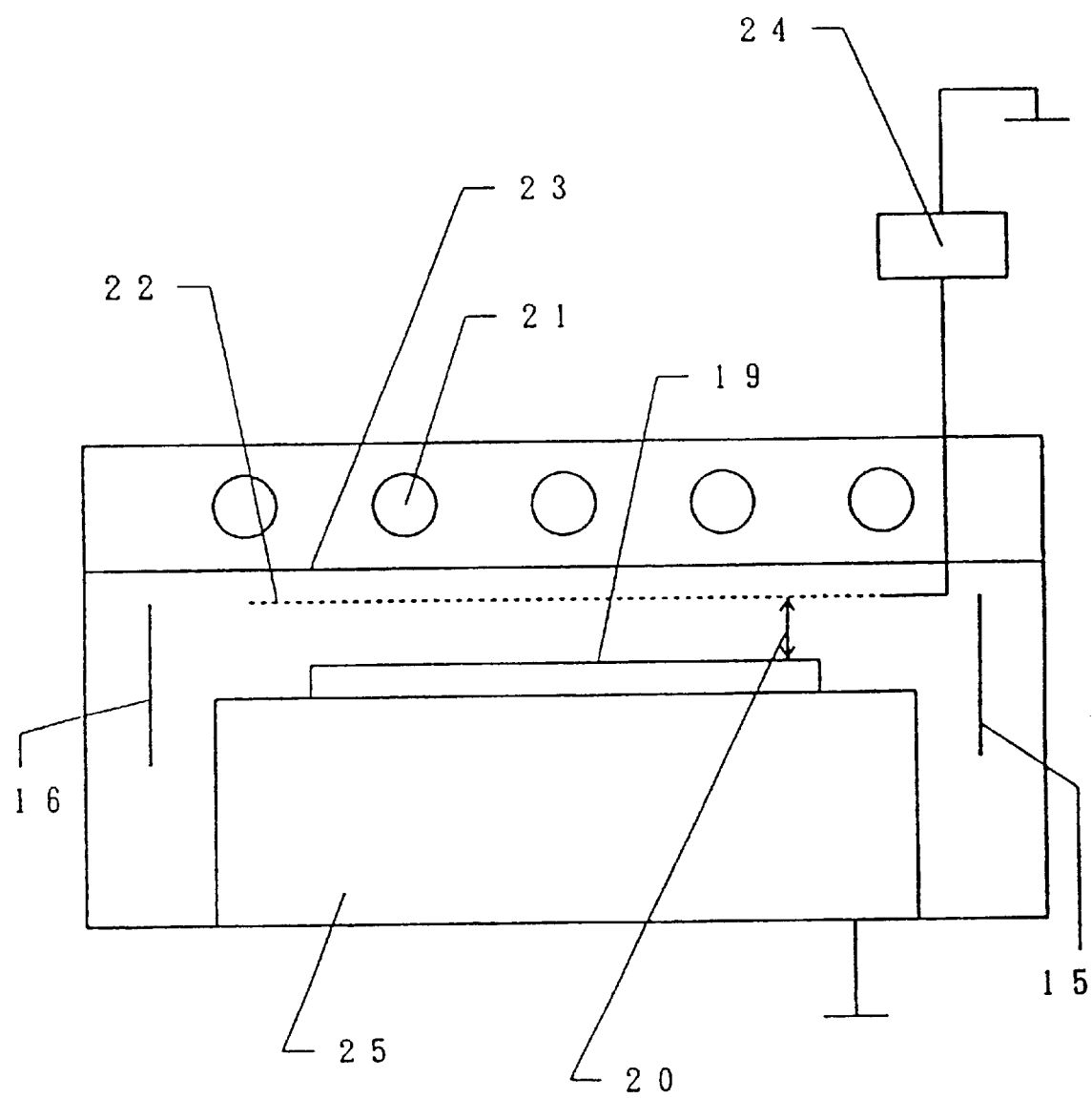
FIG. 2 is a schematically shown film deposition apparatus according to another embodiment of the present invention.

FIG. 2 is a cross section view of the film deposition apparatus shown in FIG. 1 along the line A-A'. Referring to FIG. 2, a pair of electrodes 15 and 16 are shown therein and another pair of electrodes 12 and 13 are arranged in front and back of the sheet of FIG. 2. An ultraviolet light is irradiated to the substrate 19 from an ultraviolet light source 21 (a mercury vapor lamp) through a quartz window 23. Furthermore, a high frequency power (13.56 MHz) is applied between a mesh electrode 22 and a ground electrode (on which the substrate 19 is placed) 25 by a high frequency power supply system 24. Though not shown in the figure, a means is provided to heat the substrate 19 to a desired temperature.

The mesh electrode and the ground electrode constitute a pair of parallel planar type electrodes. The distance between these electrodes is preferably set as small as possible. More preferably, the electrodes are placed at a distance of 10 mm or less from each other. The minimum distance between the electrodes is limited by the thickness of the substrate, the manner of supplying the gas, and the means of charging in and discharging out the substrate from the space between the electrodes. The film is deposited on the substrate 19 by plasma gas phase reaction effected by high frequency discharge between the mesh electrode 22 and the ground electrode 25 facing thereto, the energy supplied by ultraviolet light irradiated from the ultraviolet light source, and two forms of high frequency power having a Lissajous' waveform but differing in phases separately supplied from a pair of electrodes 15 and 16 and another pair of electrodes 12 and 13 crossing the pair of electrodes 15 and 16 making a right angle with respect thereto.

The distance between the mesh electrode 22 and the ground electrode facing thereto is reduced in order to increase the rate of film deposition. For example, it is confirmed that the rate of film deposition can be enhanced in the case of depositing a silicon oxide film using a tetraethoxysilane (TEOS; $Si(OC_2H_5)_4$) gas and oxygen. Furthermore, ultraviolet light is supplied in order to increase the height of step coverage, as well as to effectively decompose and activate organic silanes represented by TEOS and the like.

EXAMPLE 2

The present example relates to a process for depositing a silicon oxide ($SiO_2$) film by using a film deposition apparatus illustrated in FIGS. 1 and 2. Tetraethoxysilane (TEOS; $Si(OC_2H_5)_4$) was used as the starting gas for the film deposition in this example, but other organic silanes having ethoxy groups can be used as well, for example, $Si(OC_2H_5)_4$, $Si_2O(OC_2H_5)_6$, $Si_3O_2(OC_2H_5)_8$, $Si_4O_3(OC_2H_5)_{10}$, and $Si_5O_4(OC_2H_5)_{12}$.

The film deposition is effected by applying high frequency power (50 MHz) to each of the two pairs of electrodes, i.e., to the pair of the electrodes 12 and 13, as well as to the pair of electrodes 15 and 16 which are crossed with the electrodes 12 and 13 in such a manner that one pair make a right angle with respect to the other pair. The high frequency power applied to one pair of the electrodes has a constant phase difference, generally 90 degrees, with respect to that applied to the other pair of the electrodes. In this manner, a high frequency power having a Lissajous' waveform can be supplied inside the chamber. Furthermore, a high frequency power is applied between the mesh electrode 22 and the ground electrode 25 at a frequency of 13.56 MHz, and a ultraviolet light is irradiated from the ultraviolet light source 21 comprising a mercury lamp to the substrate 19. Thus, a silicon oxide film can be deposited on the substrate 19. Preferably, the substrate is heated to a temperature range of from about 200 to 600° C., preferably, to about 300° C. The reaction pressure is set in the range of from 0.01 to 10 Torr, preferably, in the range of from 0.1 to 1 Torr.

By effecting the film deposition in this manner, the reaction gas can be stirred and activated. Hence, the decomposition of the reaction gas can be accelerated by the high frequency power having the Lissajous' waveform. Moreover, films can be deposited on the substrate at a high rate and with a high step coverage by supplying a high frequency power between the mesh electrode 22 and the ground electrode 25 facing thereto, and by supplying the ultraviolet light from the ultraviolet light source 21.

In depositing a silicon oxide film by using an organic silane gas as in the process according to the present embodiment, in particular, carbon and oxygen can be reacted to form $CO_2$ by irradiating ultraviolet light to the organic silane gas. Thus, carbon can be effectively removed from the silicon oxide film and discharged to the exterior to leave a high quality silicon oxide film free of carbon. The silicon oxide film fabricated by the process according to the present embodiment can be used, for example, as a gate insulation film of thin film transistors (TFTs), a passivation film of an IC, and an inter layer insulation film of an IC.

Thus, as described in the foregoing, a high quality film having a high step coverage can be implemented by applying a high frequency power having a Lissajous' waveform and by irradiating ultraviolet light. In addition, the film can be obtained at a high film deposition rate by narrowing the distance between the pair of electrodes 22 and 25 which are provided for applying a high frequency electric field perpendicular to the substrate.

EXAMPLE 3

The present embodiment comprises, in addition to the film deposition process of Example 2 comprising irradiating ultraviolet light during the film deposition, annealing the thus deposited film while irradiating ultraviolet light to the deposited film. In this manner, for example, the interface properties of the gate insulation film of a TFT can be considerably improved. Furthermore, the effect of annealing can be further enhanced by heating the film in the temperature range of from about 200 to 500° C., preferably, at about 350° C., while irradiating the ultraviolet light.

EXAMPLE 4

The present embodiment comprises depositing a Si film using the film deposition apparatus described in Example 1. The film can be deposited by using silane ($SiH_4$) or any of the reaction gases generally used in the deposition of a non-single crystal silicon film and hydrogen gas, optionally together with a doping gas, such as phosphine ($PH_3$) and diborane ($B_2H_6$).

EXAMPLE 5

The present embodiment comprises depositing a silicon nitride ($Si_3N_4$) film by means of the film deposition apparatus described in Example 1. Silane ($SiH_4$) and ammonia ($NH_4$) are used as the reaction gases. In addition to the silicon oxide and silicon nitride films above, it is also possible to deposit $PdTiO_3$ or $TaO_5$ films by using the apparatus described in Example 1. It is also useful to effect the annealing by heating the film while irradiating ultraviolet light thereto as described in Example 3 above.

EXAMPLE 6

Figure 3:
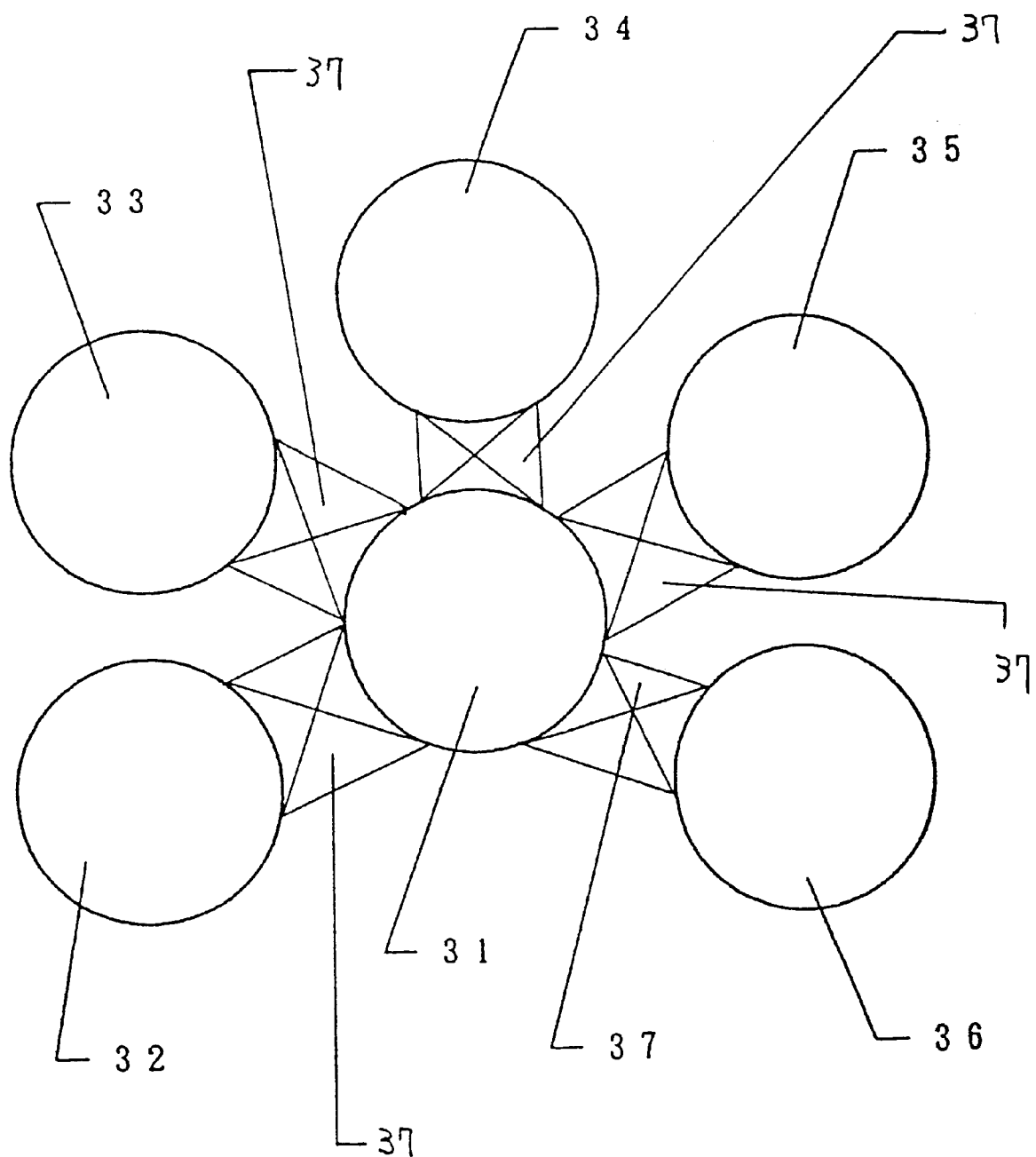
FIG. 3 is a schematically shown film deposition apparatus according to still another embodiment of the present invention.

The present embodiment comprises a plurality of film deposition apparatuses described in Example 1. The film deposition apparatuses are parallel connected to give a constitution illustrated in FIG. 3. Referring to FIG. 3, a common transportation chamber 31 for transporting substrates is provided in addition to the chambers 32 to 36 each equivalent to the film deposition apparatus described in Example 1. The constitution shown in FIG. 3, which shows the chamber only, comprises 5 sets of film deposition apparatuses illustrated in FIGS. 1 and 2 parallel connected via the transportation chamber 31. The transportation chamber 31 is connected with each of the chambers by a gate valve 37 equipped with a transportation mechanism for transferring the substrates.

The film deposition process comprises transferring the substrate into the transportation chamber 31, and after evacuating the chamber to realize a high degree of vacuum therein, transferring the substrate from the transportation chamber 31 into a first chamber (for example, a chamber 32) also evacuated to a high degree of vacuum via the gate valve 37. The gate valve 37 is then shut to perform the predetermined process of film deposition. Upon completion of the film deposition or the annealing after the film deposition, the chamber is evacuated to a high degree of vacuum to transfer the substrate again into the transportation chamber 31 evacuated to a high degree of vacuum. If necessary, film deposition is effected by transferring the substrate into a second chamber (for example, a chamber 33) in a manner similar to the operation employed in transferring the substrate into the first chamber 31.

The constitution above is particularly effective in case of sequentially depositing different films. Not all the chambers necessarily have the same constitution as that described in example 1. If necessary, a sputtering apparatus, a plasma CVD apparatus or an ion implantation apparatus may be used. Also in such cases, the substrates are transported via a common chamber 31 evacuated to a high degree of vacuum to prevent mixing of different gases and impurities.

Each of the chambers and the transportation chamber 31 are constructed independently from each other, and each of the chambers comprises a vacuum evacuation system consisting of a turbo-molecular pump or a cryopump. The vacuum evacuation system removes residual gas and impurities from the chamber.

EXAMPLE 7

Figure 4:
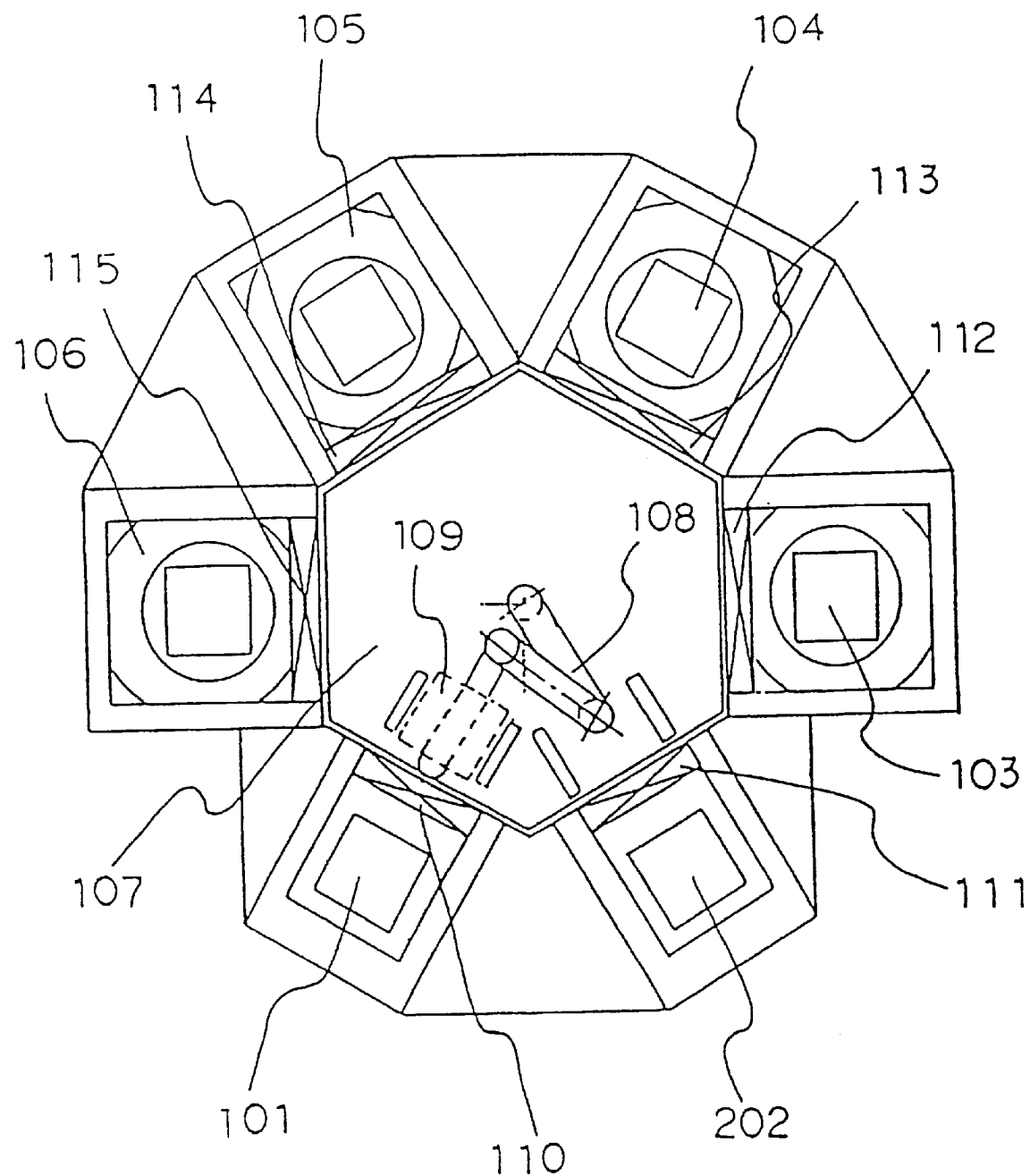
FIG. 4 shows a multi-chamber apparatus in accordance with the present invention.

FIG. 5 shows an embodiment of forming a thin film integrated circuit having at least one set of TFT by utilizing a multiobjective deposition system shown in FIG. 4. First of all, a multiobjective deposition system utilized in this embodiment is explained. In this embodiment, 101 and 106 are made as preliminary chambers loading and unloading a substrate. Here, 101 is a loader and 106 is an unloader of a substrate. 104 is a process chamber for performing rapid thermal anneal process (also referred to as RTA or RTP) by irradiation of infrared light for a short time, or performing preliminary heating. 103 is a process chamber for depositing a film mainly comprising aluminum nitride (alumioxide nitride is hereinafter called as aluminum nitride) or a silicon nitride film by a plasma CVD method. 104 is a process chamber for depositing a silicon oxide film by a plasma CVD method with utilizing TEOS as a main material. 105 is a process chamber for depositing an amorphous silicon film by a plasma CVD method. Each process chamber has an exhaustion means to make each process chamber low pressure and a gas introducing means to introduce a gas needed.

Process of forming the thin film integrated circuit is to be explained as the following. First of all, a glass substrate 201 like Corning 7059 (4×4 inches, 5×5 inches, or 5×6 inches) is carried to the preliminary chamber 101, and the preliminary chamber 101 is exhausted enough. It is preferable if this exhaustion is performed until pressure of the chamber 101 becomes the same as that of the loader 107 which has been exhausted enough. A gate valve 110 is opened, and the substrate in the preliminary chamber 101 is transported to the loader 107 by a robot arm 108. A substrate 201 in FIG. 5 is indicated as 109 in FIG. 4. From now on, meaning of "a film deposited on a substrate" is included in the meaning of "a substrate".

By opening a gate valve 112 between the preliminary chamber 101 and the reaction chamber 103 which has been exhausted to the same pressure, the substrate is transported to the reaction chamber 103. The gate valve 112 is closed after the substrate is put into the reaction chamber 103. An aluminum nitride film 202 is formed by 2000 to 5000 Å thickness by a plasma CVD method. This deposition is performed by utilizing $Al(C_4H_9)_3$, or by utilizing $Al(CH_3)_3$ and $N_2$. $N_2O$ can be added in a small amount to alleviate distortion by thermal expansion.

After the aluminum nitride film 202 is deposited, the reaction chamber 103 is exhausted so that the reaction chamber 103 would be of the same exhaustion level as that of the loader 107. By opening the gate valve 112, the substrate is transported to the loader by the robot arm 108. The substrate is transported to the anneal chamber 104 which has been exhausted in the same way. Rapid thermal anneal (RTA) by irradiation of infrared light is performed in this anneal chamber 104. This annealing is performed in an atmosphere of nitrogen, ammonia ($NH_3$), or dinitrogen monoxide ($N_2O$), rapidly heating an aluminum nitride film in a short time. This annealing makes the aluminum nitride film transparent, and improves insulating property and thermal conductivity of it. A silicon nitride film can be formed to prevent intrusion of impurities like natrium from the glass substrate to the semiconductor. In this case, the silicon nitride film is deposited by a plasma CVD method with substrate temperature 350° C., at 0.1 Torr, and in a mixed atmosphere of $SiH_4$ and $NH_3$.

The reaction chamber 104 is exhausted. The substrate is transported to the loader 107 which has been exhausted again, by the robot arm 108. And then, the substrate is transported to the reaction chamber 106 which has been exhausted in the same way. In this reaction chamber 106, a silicon oxide film 203 is deposited by a plasma CVD method utilizing TEOS as the main material. Deposition condition is shown as the following:

| | |
|---|---|
| TEOS/O$_2$ = 10/100 sccm | |
| RF power | 350 W |
| Substrate temperature | 400° C. |
| Deposition pressure | 0.25 Torr |

In above reaction, a film shown as SiOF$_x$ can be formed by adding C$_2$F$_6$.

This silicon oxide film is deposited by 2000 to 50 Å thickness as a base oxide film 203 on a surface on which TFT is to be formed. Rapid thermal annealing can be performed by transporting the silicon oxide film 203 deposited in this reaction chamber 106 to the anneal chamber 104.

The substrate is transported to the loader 107 again, and then the substrate is transported to the reaction chamber 105. Whenever the gate valve is opened or closed, the loader and each chamber are always exhausted to the same vacuum level (same low pressure level) in every step of substrate transportation.

An amorphous silicon film is deposited by 100 to 1500 Å thickness, preferably 300 to 800 Å thickness by a plasma CVD method or LPCVD method in the reaction chamber 105. Deposition condition in the plasma CVD method is as the following:

| | |
|---|---|
| SiH$_4$ = 200 sccm | |
| RF power | 200 W |
| Substrate temperature | 250° C. |
| Deposition pressure | 0.1 Torr |

This deposition may be performed by LPCVD method (low pressure thermal CVD method) utilizing Si$_2$H$_6$, Si$_3$H$_8$. In this case, gas phase reaction should be performed with substrate temperature of 450° C., and reaction pressure of 1 Torr.

The substrate is transported to the reaction chamber 106 further, and a silicon oxide film 212 is deposited by 500 to 1500 Å thickness by a plasma CVD method utilizing TEOS as the main material. This film functions as a protection film of a silicon film. Deposition condition is shown as the following:

| | |
|---|---|
| TEOS/O$_2$ = 10/100 sccm | |
| RF power | 300 W |
| Substrate temperature | 350° C. |
| Deposition pressure | 0.25 Torr |

Figure 5A:
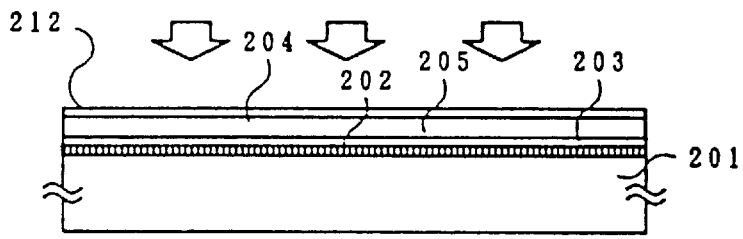
FIGS. 5(A) to 5(F) show step sequential cross-sectional structures formed in a process according to the present invention.

In this way, the blocking film 202 of aluminum nitride or silicon nitride, the silicon oxide film 203, the silicon semiconductor film 204, and the protection film 212 can be formed in a series and in multilayers on the glass substrate 201, as is shown in FIG. 5(A). As each chamber and the loader with the robot arm are partitioned by a gate valve in the system in FIG. 4, impurities will not be mixed with one another between each chamber. Especially C, N, O in the silicon film can be at least $5 \times 10^{18}$ cm$^{-3}$ or less.

Figure 5B:
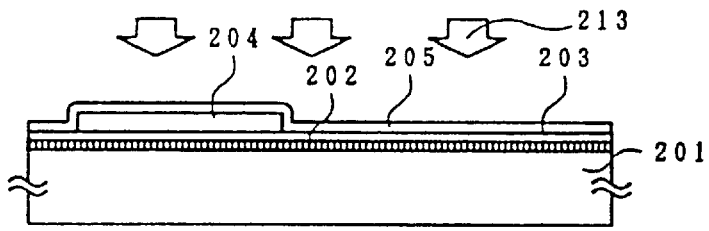
Figure 5C:
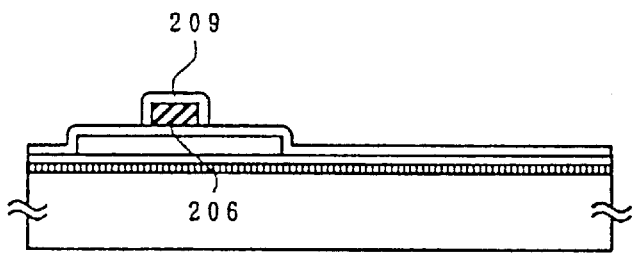

The substrate is taken out of the preliminary chamber 101, and patterning is performed to form an island silicon region 204. As is shown in FIG. 5(B), a silicon oxide film 205 is formed by 200 to 1500 Å thickness, preferably 500 to 1000 Å thickness. This silicon oxide film also functions as a gate insulating film. Therefore this silicon oxide film should be formed very carefully. Here, TEOS is utilized as a material, and the film is formed in a deposition apparatus shown in FIG. 1 and FIG. 2 (i.e. the reaction chamber 106 in FIG. 4).

In depositing the silicon oxide film, two pairs of electrodes in vertical to one another are utilized. Each pair is a pair of electrodes 12 and 13, and a pair of electrodes 15 and 16. By applying a constant phase difference (usually 90°) and high frequency electric power (50 MHz), a high frequency electric power of Lissajous waves is provided to the chamber. High frequency electric power of 13.56 MHz is supplied between a mesh electrode 22 and an earth electrode 25. By supplying ultraviolet light from an ultraviolet light source 21 comprising a mercury lamp to the substrate 19 (109 in FIG. 4), a silicon oxide film 205 is formed. Here, the substrate is heated to approximately 200 to 600° C., preferably 300° C. Reaction pressure is 0.01 to 10 Torr, preferably 0.1 to 1 Torr.

In this case, the reaction gas is mixed and activated by high frequency electric power of Lissajous' waves, and decomposition is accelerated with high efficiency. Deposition with high step coverage can be performed at a high rate on a substrate by high frequency electric power provided between the mesh electrode 22 and an opposite earth electrode 25, and by ultraviolet light from the ultraviolet light source 21.

In the case of forming a silicon oxide film by utilizing organic silane gas like this example 7, C (carbon) is reacted with O (oxygen) by irradiation of ultraviolet light, and carbon can be taken outside as CO$_2$ from the silicon oxide film. A silicon oxide film with good quality without C (carbon) can be obtained.

A film of high quality with high step coverage can be obtained by applying high frequency electric power of Lissajous' waves, and by irradiation of ultraviolet light. In addition, by narrowing the space between the pair of electrodes 22 and 25 which applies high frequency electric field to the substrate in vertical direction, high deposition speed can be obtained.

It is effective to perform rapid thermal anneal by irradiation of infrared light in N$_2$O atmosphere after the silicon oxide film 205 is formed and the substrate is loaded to the anneal chamber 104. This is particularly effective in decreasing interface state between the silicon oxide film 205 and the silicon region 204.

As is shown in FIG. 5(B), a silicon region 204 is crystallized by irradiating KrF excimer laser 213 (wavelength 248 nm or 308 nm, pulse width 20 nsec). Energy density of laser is 200 to 400 mJ/cm$^2$, preferably 250 to 300 mJ/cm$^2$. During irradiation of laser, the substrate is heated at 300 to 500° C. According to study by RAMAN spectrum for crystal character of the silicon film 204 formed in this way, relatively broad peak is observed at approximately 515 cm$^{-1}$, different from that of single-crystal silicon (521 cm$^{-1}$). It is found that the silicon film 204 has become crystal semiconductor, for example, polycrystal semiconductor. After that, the silicon film 204 is annealed at 350° C. in hydrogen for two hours. The process of this crystallization can be performed by heating.

After that, an aluminum film of 2000 Å to 1 μm is formed by electron beam deposition method. This is patterned, and a gate electrode 206 is formed. Scandium (Sc) can be doped in aluminum by 0.15 to 0.2% by weight. Nextly, the substrate is dipped in ethylene glycol solution of pH=7 containing tartaric acid of 1 to 3%. Anodic oxidation is performed with platinum as a cathode and this gate electrode of aluminum as an anode. In anodic oxidation, voltage is increased to 220V at first with constant current, and is kept for an hour, and is finished. In this embodiment, under condition of constant current, it is appropriate increase speed of voltage is 2–5V/minute. In this way, anodic oxide 209 of 1500 to 3500 Å thickness, for example, 2000 Å thickness is formed. (FIG. 5(C))

After that, by ion doping method (also referred to as plasma doping method), an impurity (phosphorus) is implanted in self-align way to an island silicon film of each TFT, with utilizing the gate electrode portion as a mask. As doping gas, phosphine ($PH_3$) is utilized. Dose amount is 1 to $4 \times 10^{15}$ $cm^{-2}$.

Figure 5D:
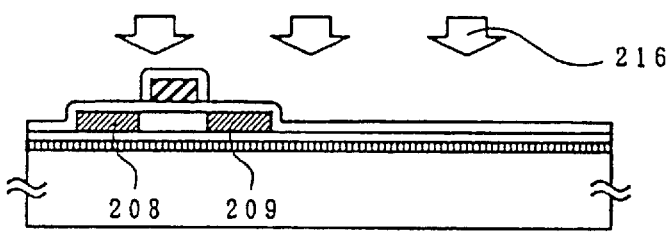
Figure 5E:
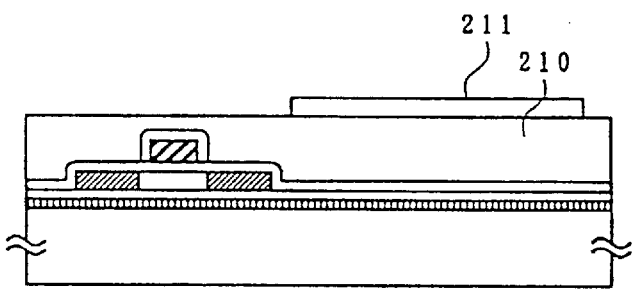
Figure 5F:
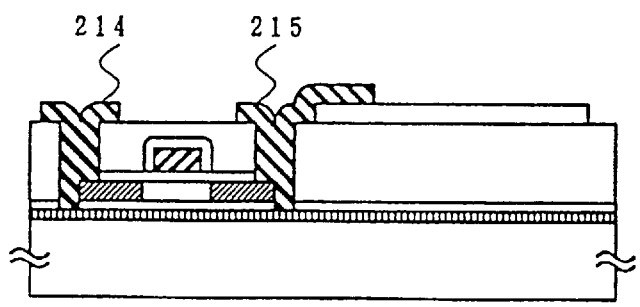

As is shown in FIG. 5(D), by irradiating KrF excimer laser 216 (wavelength 248 nm or 308 nm, pulse width 20 nsec), crystal character of the portion of which crystal character has been degraded by above mentioned implant of impurity is improved. Energy density of laser is 150 to 400 $mJ/cm^2$, preferably 200 to 250 $mJ/cm^2$. In this way, N type impurity (phosphorus) regions 208 and 209 are formed. Seat resistance of these regions is 200 to 800 $\Omega/cm^2$. In this process, what is called RTP (rapid thermal process) can be also utilized. In RTP, the sample is heated not by utilizing laser but by utilizing flash lamp to heat the sample at 1000 to 1200° C. (the temperature of silicon monitor) in a short time.

After that, an interlayer insulator 210 comprising silicon oxide is formed on the whole surface by utilizing a chamber 104 of the apparatus in FIG. 4 to a thickness of 0.3 µm to 1 µm, e.g. 3000 Å (0.3 µm), by a plasma CVD method utilizing TEOS as a material and oxygen, a low pressure CVD method, or a normal pressure CVD method with ozone. The substrate temperature is 250 to 450° C., e.g. 350° C. After deposition, to obtain flatness on the surface, this silicon oxide film is mechanically polished. In this process, isotropic dry etching can be performed by utilizing the reaction chamber provided in the apparatus in FIG. 4. Furthermore, an ITO film is deposited by sputter method, and a pixel electrode 211 is formed by patterning this. (FIG. 5(E))

In this way, a thin film integrated circuit can be formed on one side of the substrates of the electro-optical device in FIG. 5. Of course, peripheral circuits can be formed on the same substrate simultaneously with the circuit shown in this figure. By etching the interlayer insulator 210, a contact hole is formed in source/drain of TFT as is shown in FIG. 5(E). Wirings 212 and 213 of chromium or titanium nitride are formed, and the wiring 213 is connected to the pixel electrode 211. Here, the contact hole can be formed protruding the source/drain region (island silicon). In this case, the area of the contact hole protruding the island silicon accounts for 30 to 70% of the contact hole. In this case, a contact is formed not only on the upper surface of the source/drain but also on the side surface of the source/drain. Hereinafter a contact like this is called as a top side contact. In the conventional structure, to form a top side contact, a silicon oxide film of the base other than the island silicon, and the substrate further were etched during an etching step of the interlayer insulator. In this embodiment, the aluminum nitride film or silicon nitride film 202 functions as an etching stopper, and etching is stopped there.

In usual cases, it was imperative that the size of the contact hole should be smaller than source/drain. On the contrary, in the top side contact, the size of an island can be smaller than that of the contact hole. As a result, it was possible to make the island very small. On the contrary, because the contact hole can be made bigger, mass production and reliability can be improved.

Hydrogenation of silicon is completed by annealing at 300 to 400° C. for 0.1 to 2 hours in hydrogen. In this way, a thin film integrated circuit having TFT is completed. Many sets of TFT formed simultaneously are arranged in matrix, and a monolithic type active matrix liquid crystal display device having peripheral circuits on the same substrates is formed.

As described in the foregoing, the present invention comprises arranging two pairs of parallel planar type electrodes in such a manner that an electric field can be applied in parallel with the substrate. More specifically, one pair is set in such a manner that it may cross the other pair making right angle with respect to the other pair, and placing the substrate on one of the third pair of parallel planar type electrodes installed with a small distance taken therebetween. A high frequency power having a Lissajous's waveform is applied from the crossing two pairs of electrodes while irradiating ultraviolet light to the substrate. In this manner, a film having a superior quality and a high step coverage can be deposited at a high deposition rate.

Although the mercury lamp is used in the foregoing, other means for irradiating an ultraviolet light to the substrate can be used instead.

While the invention has been described in detail and with reference to specific embodiments thereof, it will be apparent to one skilled in the art that various changes and modifications can be made therein without departing from the spirit and scope thereof.

What is claimed is:

1. A method of manufacturing a semiconductor device including at least a thin film transistor, said method comprising the steps of:

forming a semiconductor island over a substrate;

forming a gate electrode adjacent to the semiconductor film;

forming a gate insulating film between the semiconductor film and the gate electrode;

forming source and drain regions in the semiconductor island;

wherein the step of forming the gate insulating film includes the following steps of:

arranging a pair of parallel planar type electrodes, wherein a distance between the parallel planar type electrodes is not larger than 10 mm;

arranging a plurality of electrodes in such a manner that the plurality of electrodes may cross each other;

placing the substrate in a space between the parallel planar type electrodes parallel thereto;

supplying a process gas comprising an organic silane into the space;

applying a first power to the parallel planar type electrodes to generate a plasma;

applying a second power to the plurality of electrodes to form an electric field having a Lissajous' waveform in a plane parallel to a surface of the substrate in order to improve step coverage; and irradiating the substrate with an ultraviolet light.

2. The method of claim 1 wherein the deposition of the insulating film is carried out using a gas comprising an ethoxy group.

3. The method of claim 1 wherein the parallel planar type electrodes are arranged in parallel with the substrate.

4. The method of claim 1 wherein the plurality of electrodes are arranged in a direction vertical to the substrate.

5. The method of claim 1 wherein said organic silane is selected from a group of $Si(OC_2H_5)_4$, $Si_2O(OC_2H_5)_6$, $Si_3O_2(OC_2H_5)_8$, $Si_4O_3(OC_2H_5)_{10}$, and $Si_5O_4(OC_2H_5)_{12}$.

6. The method of claim 1, wherein said semiconductor device is an integrated circuit.

7. A method of forming an insulating film, said method comprising the steps of:

arranging a pair of parallel planar type electrodes, wherein a distance between the parallel planar type electrodes is not larger than 10 mm;

arranging a plurality of electrodes in such a manner that the plurality of electrodes may cross each other;

placing the substrate in a space between the parallel planar type electrodes parallel thereto;

supplying a process gas comprising an organic silane into the space;

applying a first power to the parallel planar type electrodes to generate a plasma;

applying a second power to the plurality of electrodes to form an electric field having a Lissajous' waveform in a plane parallel to a surface of the substrate in order to improve step coverage; and irradiating the substrate with an ultraviolet light.

8. The method of claim 7 wherein the insulating film is deposited over the substrate by a vapor phase reaction.

9. The method of claim 8 further comprising the step of annealing the insulating film while irradiating the ultraviolet light to the insulating film.

10. The method of claim 9 wherein the insulating film is heated during the annealing.

11. The method of claim 7 wherein the second power has a frequency of 1 MHz to 1000 MHz.

12. The method of claim 8 wherein the second power is in parallel with the substrate.

13. The method of claim 7 wherein the parallel planar type electrodes are arranged in parallel with the substrate.

14. The method of claim 7 wherein the plurality of electrodes are arranged in a direction vertical to the substrate.

15. The method of claim 7 wherein a distance between the parallel planar type electrodes is not larger than 10 mm.

16. The method of claim 7 wherein said organic silane is selected from a group of $Si(OC_2H_5)_4$, $Si_2O(OC_2H_5)_6$, $Si_3O_2(OC_2H_5)_8$, $Si_4O_3(OC_2H_5)_{10}$, and $Si_5O_4(OC_2H_5)_{12}$.

17. A method of manufacturing a semiconductor device including at least a thin film transistor, said method comprising the steps of:

forming a semiconductor island over a substrate;

forming a gate electrode adjacent to the semiconductor film;

forming a gate insulating film between the semiconductor film and the gate electrode;

forming source and drain regions in the semiconductor island;

wherein the step of forming the gate insulating film includes the following steps of:

arranging a pair of parallel planar type electrodes;

arranging a plurality of electrodes in such a manner that the a plurality of electrodes may cross each other;

placing the substrate in a space between the pair of parallel planar type electrodes parallel thereto;

supplying a process gas comprising an organic silane into the space;

applying a first power to the pair of parallel planar type electrodes to generate a plasma; and applying a second power to the plurality of electrodes to form an electric field having a Lissajous' waveform in a plane parallel to a surface of the substrate in order to improve step coverage; and irradiating the substrate with an ultraviolet light.

18. The method of claim 17 wherein a distance between the parallel planar type electrodes is not larger than 10 mm.

19. The method of claim 17 wherein said organic silane is selected from a group of $Si(OC_2H_5)_4$, $Si_2O(OC_2H_5)_6$, $Si_3O_2(OC_2H_5)_8$, $Si_4O_3(OC_2H_5)_{10}$, and $Si_5O_4(OC_2H_5)_{12}$.

20. The method of claim 17, wherein said semiconductor device is an integrated circuit.

* * * * *